United States Patent
Xu et al.

(10) Patent No.: US 9,762,208 B2
(45) Date of Patent: Sep. 12, 2017

(54) VERY WIDE BANDWIDTH COMPOSITE BANDPASS FILTER WITH STEEP ROLL-OFF

(71) Applicant: Avago Technologies General IP (Singapore) Pte. Ltd., Singapore (SG)

(72) Inventors: Hongya Xu, Munich (DE); Andriy Yatsenko, Munich (DE); Lueder Elbrecht, Munich (DE); Martin Handtmann, Riemerling (DE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 91 days.

(21) Appl. No.: 14/870,991

(22) Filed: Sep. 30, 2015

(65) Prior Publication Data
US 2017/0093365 A1    Mar. 30, 2017

(51) Int. Cl.
  *H03H 9/54* (2006.01)
  *H03H 7/46* (2006.01)
  *H03H 9/205* (2006.01)
  *H03H 7/01* (2006.01)

(52) U.S. Cl.
  CPC .......... *H03H 9/542* (2013.01); *H03H 7/0161* (2013.01); *H03H 7/1741* (2013.01); *H03H 7/46* (2013.01); *H03H 9/205* (2013.01)

(58) Field of Classification Search
  CPC .... H03H 9/542; H03H 7/0115; H03H 7/1741; H03H 7/175; H03H 7/1758; H03H 7/46; H03H 7/0161; H03H 9/205
  USPC ........ 333/133, 187, 188, 189, 193–196, 175
  See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 5,910,756 A * | 6/1999 | Ella | H03H 9/0095 310/322 |
| 6,107,721 A | 8/2000 | Lakin et al. | |
| 6,404,279 B2 | 6/2002 | Thomasson | |

(Continued)

FOREIGN PATENT DOCUMENTS

JP    10150342 A    6/1998

OTHER PUBLICATIONS

Dai Enguang, "SAW Filter with Insertion Loss of 2 dB and fractional bandwidth of 30 percent", Oct. 20, 1999, Ultrasonics Symposium, 1999 IEEE, pp. 25-28.*

(Continued)

*Primary Examiner* — Robert Pascal
*Assistant Examiner* — Jorge Salazar, Jr.

(57) ABSTRACT

A very wide bandwidth composite band pass filter with steep roll-off of a corresponding passband includes a band pass filter and a high-Q acoustic resonator. The band pass filter has a corresponding passband with a very wide bandwidth and a passband roll-off. The high-Q acoustic filter has a corresponding stopband with a roll-off steeper than the passband roll-off, the high-Q acoustic filter being connected in parallel with the band pass filter such that a portion of the stopband is within the passband of the band pass filter, forming a combined passband. A frequency range of the combined passband is approximately the same as a frequency range of the passband of the band pass filter, and a combined roll-off of the combined passband is steeper on one side than the passband roll-off of the band pass filter.

18 Claims, 6 Drawing Sheets

(56) References Cited

U.S. PATENT DOCUMENTS

| | | | |
|---|---|---|---|
| 6,507,983 B1 | 1/2003 | Ruby et al. | |
| 6,828,713 B2 | 12/2004 | Bradley et al. | |
| 7,102,460 B2* | 9/2006 | Schmidhammer | H03H 9/0038 |
| | | | 333/133 |
| 7,126,440 B2 | 10/2006 | Bradley et al. | |
| 7,164,306 B2 | 1/2007 | Makino | |
| 7,190,970 B2 | 3/2007 | Ochii et al. | |
| 7,280,007 B2 | 10/2007 | Feng et al. | |
| 7,345,410 B2 | 3/2008 | Grannen et al. | |
| 7,388,454 B2 | 6/2008 | Ruby et al. | |
| 7,561,009 B2 | 7/2009 | Larson et al. | |
| 7,629,865 B2 | 12/2009 | Ruby et al. | |
| 7,714,684 B2 | 5/2010 | Ruby et al. | |
| 7,791,434 B2 | 9/2010 | Fazzio et al. | |
| 7,880,566 B2 | 2/2011 | Wada | |
| 8,018,304 B2 | 9/2011 | Jian | |
| 8,188,810 B2 | 5/2012 | Feng et al. | |
| 8,230,562 B2 | 7/2012 | Fazzio et al. | |
| 8,248,185 B2 | 8/2012 | Choy et al. | |
| 2002/0180562 A1 | 12/2002 | Taniguchi | |
| 2004/0209590 A1 | 10/2004 | Forrester et al. | |
| 2006/0067254 A1 | 3/2006 | Mahbub et al. | |
| 2007/0205850 A1 | 9/2007 | Jamneala et al. | |
| 2008/0315973 A1* | 12/2008 | Nakamura | H03H 9/0222 |
| | | | 333/196 |
| 2010/0091690 A1 | 4/2010 | Boyle | |
| 2010/0091752 A1 | 4/2010 | Kemmochi et al. | |
| 2010/0327994 A1 | 12/2010 | Choy et al. | |
| 2011/0180391 A1 | 7/2011 | Larson et al. | |
| 2011/0241798 A1* | 10/2011 | Hong | H03H 7/0115 |
| | | | 333/175 |
| 2011/0266925 A1 | 11/2011 | Ruby et al. | |
| 2012/0177816 A1 | 7/2012 | Larson et al. | |
| 2012/0326807 A1 | 12/2012 | Choy et al. | |
| 2015/0222246 A1 | 8/2015 | Nosaka | |

OTHER PUBLICATIONS

Co-pending U.S. Appl. No. 14/161,564, filed Jan. 22, 2014.
Co-pending U.S. Appl. No. 13/662,460, filed Oct. 27, 2012.
Co-pending U.S. Appl. No. 13/906,873, filed May 31, 2013.
Co-pending U.S. Appl. No. 14/191,771, filed Feb. 27, 2014.
Chen, et al., "Process Variation Aware Wide Tuning Band Pass Filter for Steep Roll-Off High Rejection", Hindawi Publishing Corporation, VLSI Design, vol. 2015, Article ID 408035, 9 pages, 2015.
English language machine translation of JP10150342A, published Jun. 2, 1998, 16 pages.
Office Action dated Jun. 27, 2017 in co-pending U.S. Appl. No. 15/010,240, 32 pages.

* cited by examiner

VERY WIDE BANDWIDTH COMPOSITE BANDPASS FILTER WITH STEEP ROLL-OFF

BACKGROUND

Portable communication devices, such as cellular telephones, portable computers, personal digital assistants (PDAs), and the like, are configured to communicate over wireless networks. Such portable communication devices may enable communication over multiple networks, each of which has corresponding transmit and receive frequency bands within a composite broadband frequency range. Depending on design requirements, the frequency bands may have large spectrums and/or may be separated from one another by a significant range of frequencies. For example, the composite broadband frequency range may span from about 1700 MHz to about 2170 MHz, and may include multiple time division duplex (TDD) frequency bands of networks over which a communication device is able to transmit and receive radio frequency (RF) signals, such as band 1 (uplink 1920-1980 MHz; downlink 2110-2170 MHz), band 2 (uplink 1850-1910 MHz; downlink 1930-1990 MHz), band 3 (uplink 1710-1785 MHz; downlink 1805-1880 MHz), band 4 (uplink 1710-1755 MHz; downlink 2110-2155 MHz), and band 25 (uplink 1850-1915 MHz; downlink 1930-1995 MHz), for example. To provide filtering of the RF signals in a composite broadband frequency range requires a very large passband for transmitting and receiving the full range of frequencies. Very wide bandwidth band pass filters are therefore provided to accommodate the large passbands. A very wide bandwidth may be considered any bandwidth in excess about eight percent of a center frequency $f_{center}$.

Various different types of band pass filters may be used in communication devices, including LC filters reliant on inductors and capacitors, and acoustic filters reliant on acoustic resonators. The acoustic resonators may include surface acoustic wave (SAW) resonators or bulk acoustic wave (BAW) resonators, for example, where the BAW resonators may include thin film bulk acoustic resonators (FBARs) and/or solidly mounted resonators (SMRs). Generally, LC filters are able to provide very wide bandwidths. However, LC filters do not provide sufficiently steep roll-off for corresponding passbands at the very wide bandwidths, with acceptably low insertion loss for efficient operation. Roll-off is a filter characteristic indicating how quickly the transition occurs between the filter passband and the filter stop band on either side of the passband, where the steeper the roll-off, the more efficient the transition. Generally, the steepness of the roll-off increases (i.e., thus improves) using higher order filters. However, the higher the order of an LC filter, in particular, the greater the insertion loss. However, acoustic filters are not able to accommodate sufficiently wide bandwidths, e.g., due to limited intrinsic acoustic coupling, to be used as very wide bandwidth filters.

Accordingly, there is a need for a band pass filter that combines a very wide passband with a steep roll-off, without unacceptable increases to insertion loss.

In addition, portable devices configured to communicate over multiple frequency bands, and thus multiple wireless networks, may include transmitters, receivers and corresponding band pass filters in multiplexers, connecting the receivers and transmitters to a common antenna, for sending and receiving signals over the multiple wireless networks. A multiplexer interfaces between the antenna and each of the networks to enable transmitting signals on different transmit (uplink) frequencies and receiving signals on different receive (downlink) frequencies. Conventional multiplexers providing band pass filters for different networks tend to be complicated in design, and to have relatively high insertion loss.

What is needed therefore is a filter that overcomes at least the drawbacks described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
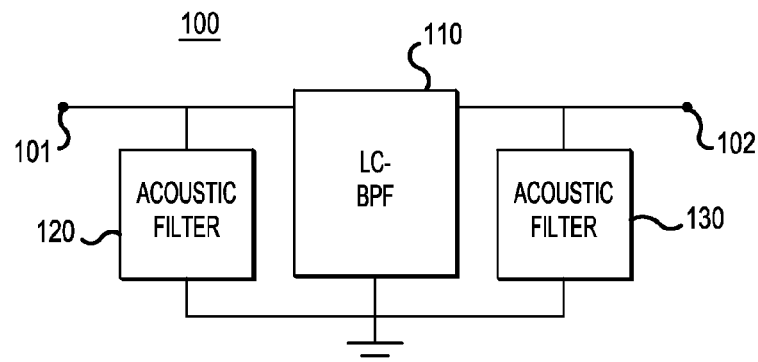
FIG. 1 is a simplified block diagram of a very wide bandwidth composite band pass filter with steep roll-off on both sides of a passband, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

It is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Generally, according to various embodiments, a very wide bandwidth filter combines a lower order LC filter, which provides the ultra high bandwidth, and at least one high-Q acoustic filter, which provides a sharp roll-off of the passband, without affecting or otherwise reducing insertion loss.

FIG. 1 is a block diagram of a very wide bandwidth band pass filter with steep roll-off, according to a representative embodiment.

Referring to FIG. 1, very wide bandwidth composite band pass filter 100 includes an LC band pass filter 110 connected in parallel with first high-Q acoustic filter 120 and second high-Q acoustic filter 130. High-Q refers to quality factor (Q-factor) of resonators in the first and second high-Q acoustic filters 120 and 130. Generally, the Q-factor is an indication of the rate at which an oscillating resonator loses energy. The higher the Q-factor, the lower the rate of energy loss (meaning the oscillation of the resonator lasts longer). As will be appreciated by one of ordinary skill in the art, an acoustic resonator, such as a bulk acoustic wave (BAW) resonator is considered to be a high-Q resonator. The LC band pass filter 110 includes inductors and capacitors, and each of the first and second high-Q acoustic filters 120 and 130 includes at least one acoustic resonator, as discussed below with reference to FIG. 2. The very wide bandwidth composite band pass filter 100 further includes a first terminal 101 and a second terminal 102, where the first terminal may be connected to an antenna and the second terminal may be connected to a transceiver, for example.

The LC band pass filter 110 and the first and second high-Q acoustic filters 120 and 130 connected in parallel provide a combined passband having a very wide bandwidth with steep combined roll-off, while maintaining low insertion loss, as compared to a conventional very wide bandwidth filter consisting only of an LC band pass filter. Generally, the LC band pass filter 110 provides a passband having a very wide bandwidth. For example, a bandwidth (of the LC band pass filter 110) is considered a very wide bandwidth when it is at least about eight percent of center frequency $f_{center}$ of the passband, where the center frequency is a measure of a central frequency between upper and lower cutoff frequencies of the passband. Each of the first and second high-Q acoustic filters 120 and 130 has corresponding first and second stopbands, respectively. For example, each of a first roll-off of the first high-Q acoustic filter 120 and a second roll-off of the second high-Q acoustic filter 130 is substantially vertical, and thus steeper than the passband roll-off of the LC band pass filter 110.

The addition of the first and second high-Q acoustic filters 120 and 130, connected in parallel with the LC band pass filter 110, therefore results in the first stopband curtailing one side (e.g., a low frequency side) of the passband and the second stopband curtailing the other side (e.g., a high frequency side) of the passband, thereby increasing the steepness of the passband roll-off of the passband of the LC band pass filter 110, providing a steep combined roll-off. In other words, a portion of the first stopband is within one side of the passband of the LC band pass filter 110, a portion of the second stopband is within another side of the passband of the LC band pass filter 110, forming the combined passband with the steep combined roll-off. For example, the combined roll-off may be considered satisfactorily steep when it is less than about two percent of the center frequency $f_{center}$. At the same time, the addition of the first and second high-Q acoustic filters 120 and 130 maintains (or decreases the insertion loss), and has little to no effect on the very wide bandwidth of the passband provided by the LC band pass filter 110. That is, a frequency range of the combined passband is approximately the same as a frequency range of the passband of the LC band pass filter 110.

In certain representative embodiments, one or both of the first and second high-Q filters 120, 130 comprise a bulk acoustic wave (BAW) resonator filter, comprising a BAW resonator. Various details of such BAW resonators and filters and corresponding methods of fabrication contemplated by the present teachings, may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629,865, 7,714,684 to Ruby et al.; U.S. Pat. Nos. 7,791,434, 8,188,810, and 8,230,562 to Fazzio, et al.; U.S. Pat. No. 7,280,007 to Feng et al.; U.S. Pat. No. 8,248,185 to Choy, et al.; U.S. Pat. No. 7,345,410 to Grannen, et al.; U.S. Pat. No. 6,828,713 to Bradley, et al.; U.S. Pat. No. 7,561,009 to Larson, et al.; U.S. Patent Application Publication No. 20120326807 to Choy, et al.; U.S. Patent Application Publication No. 20100327994 to Choy, et al.; U.S. Patent Application Publications Nos. 20110180391 and 20120177816 to Larson III, et al.; U.S. Patent Application Publication No. 20070205850 to Jamneala et al.; U.S. Patent Application Publication No. 20110266925 to Ruby, et al.; U.S. patent application Ser. No. 14/161,564 entitled: "Method of Fabricating Rare-Earth Doped Piezoelectric Material with Various Amounts of Dopants and a Selected C-Axis Orientation," filed on Jan. 22, 2014 to John L. Larson III; U.S. patent application Ser. No. 13/662,460 entitled "Bulk Acoustic Wave Resonator having Piezoelectric Layer with Multiple Dopants," filed on Oct. 27, 2012 to Choy, et al.; U.S. patent application Ser. No. 13/906,873 entitled "Bulk Acoustic Wave Resonator having Piezoelectric Layer with Varying Amounts of Dopant" to John Choy, et al. and filed on May 31, 2013; and U.S. patent application Ser. No. 14/191,771, entitled "Bulk Acoustic Wave Resonator having Doped Piezoelectric Layer" to Feng, et al. and filed on Feb. 27, 2014. The entire disclosure of each of the patents, published patent applications and patent applications listed above are hereby specifically incorporated by reference herein. It is emphasized that the components, materials and method of fabrication described in these patents and patent applications are representative and other methods of fabrication and materials within the purview of one of ordinary skill in the art are also contemplated.

Figure 2:
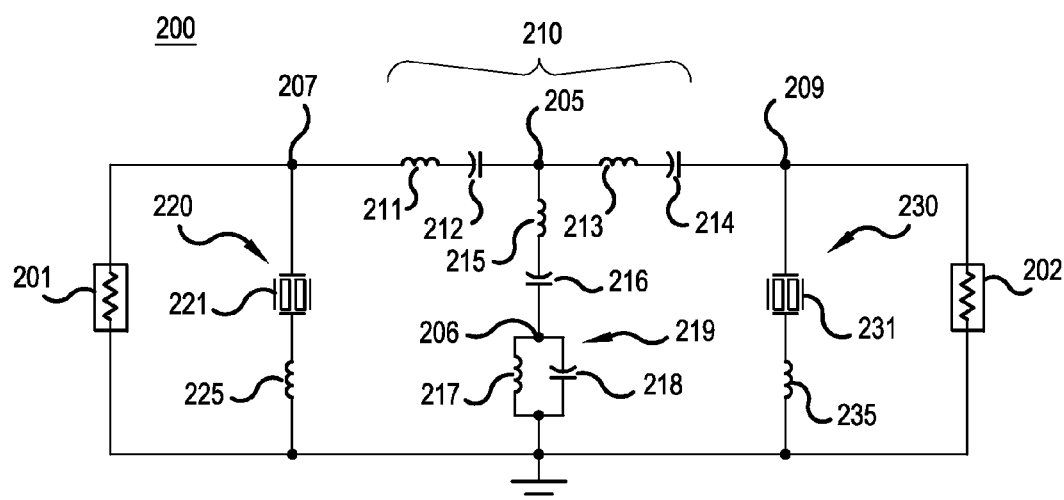
FIG. 2 is a circuit diagram of a very wide bandwidth composite band pass filter with steep roll-off on both sides of a passband, according to a representative embodiment.

FIG. 2 is a circuit diagram of a very wide bandwidth band pass filter with steep roll-off, according to a representative embodiment. The circuit diagram of FIG. 2 is an illustrative implementation of the block diagram of FIG. 1, although other circuit configurations of the LC band pass filter and/or the first and second high-Q resonator filters may be incorporated without departing from the scope of the present teachings.

Referring to FIG. 2, very wide bandwidth composite band pass filter 200 includes an LC band pass filter 210, and a first high-Q acoustic filter 220 and a second high-Q acoustic filter 230 connected in parallel with the LC band pass filter 210, on opposite sides of the LC band pass filter 210. The very wide bandwidth composite band pass filter 200 also includes a first terminal 201 and a second terminal 202. The first terminal 201 (e.g., having a 50 ohm impedance) may be connected to an antenna (not shown) and the second terminal 202 (e.g., also having a 50 ohm impedance) may be connected to a transceiver (not shown), for example, in which case the first terminal 201 is an input terminal and the second terminal 202 is an output terminal when the transceiver is receiving signals, and the first terminal 201 is an output terminal and the second terminal 202 is an input terminal when the transceiver is transmitting signals.

In the depicted embodiment, the LC band pass filter 210 includes a first inductor 211 and a first capacitor 212 connected in series between the first terminal 201 and a first node 205, and a second inductor 213 and a second capacitor 214 connected in series between the first node 205 and the second terminal 202. The LC band pass filter 210 also includes a third inductor 215, a third capacitor 216 and parallel LC circuit 219 connected in series between the first node 205 and ground voltage. The parallel LC circuit 219 includes a fourth inductor 217 and a fourth capacitor 218 connected in parallel with one another between a second node 206 and the ground voltage. The first and second inductors 211 and 213 may be referred to as series inductors, and the third and fourth inductors 215 and 217 may be referred to shunt inductors. Similarly, the first and second capacitors 212 and 214 may be referred to as series capacitors, and the third and fourth capacitors 216 and 218 may be referred to as shunt capacitors.

In this example, the first and second inductors 211 and 213 have inductance values of about 15.260 nH, the third inductor 215 has an inductance value of about 5.667 nH, and the forth inductor has an inductance value of about 1.377 nH, while the first and second capacitors 212 and 214 have capacitance values of about 463.6 fF, the third capacitor 216 has a capacitance value of about 1.248 pF and the fourth capacitor 218 has a capacitance value of about 5.137 pF. Of course, the values of the inductors and capacitors of the LC band pass filter 210 may vary to provide unique benefits for any particular situation or to meet application specific design requirements of various implementations, as would be apparent to one skilled in the art.

Also in the depicted embodiment, the first and second high-Q acoustic filters 220 and 230 are configured substantially the same as one another. The first high-Q acoustic filter 220 includes a first FBAR 221 connected in series with a fifth inductor 225 between a third node 207 and the ground voltage. Similarly, the second high-Q acoustic filter 230 includes a second FBAR 231 connected in series with a sixth inductor 235 between a forth node 208 and the ground voltage. Although the first and second high-Q acoustic filters 220 and 230 are shown as including FBARs as the acoustic elements, respectively, it is understood that other types of BAW acoustic resonators, such as SMRs, as well as SAW resonators, may alternatively be implemented as one or both of the first and second high-Q acoustic filters 220 and 230 without departing from the scope of the present teachings Also, in this example, the fifth and sixth inductors 225 and 235 have inductance values of approximately 3 nH. Of course, the inductance values of the inductors of the first and second high-Q acoustic filters 220 and 230, as well as the various characteristics of the first and second high-Q acoustic resonators 221 and 231, may vary to provide unique benefits for any particular situation or to meet application specific design requirements of various implementations, as would be apparent to one skilled in the art.

As discussed above, a first roll-off of the first high-Q acoustic filter 220 and a second roll-off of the second high-Q acoustic filter 230 are each substantially vertical, and steeper than the passband roll-off of the LC band pass filter 210. The inclusion of the first and second high-Q acoustic filters 220 and 230, connected in parallel with the LC band pass filter 210, therefore results in the first stopband curtailing one side (e.g., a low frequency side) of the passband and the second stopband curtailing the other side (e.g., a high frequency side) of the passband, thereby increasing the steepness of the roll-off of the passband of the LC band pass filter 210.

Figure 3:
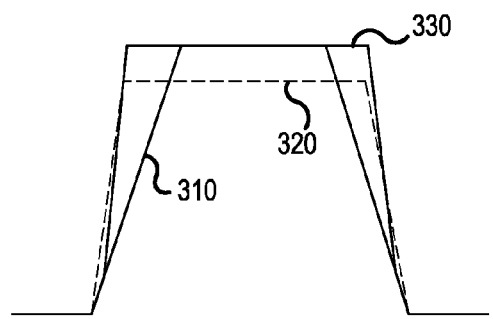
FIG. 3 is a simplified graph showing insertion loss as function of signal frequency, for purposes of comparing responses of conventional lower order and higher order LC band pass filters and a very wide composite bandwidth band pass filter with steep roll-off on both sides of a passband, according to a representative embodiment.

FIG. 3 is a simplified graph showing insertion loss as function of RF signal frequency, for purposes of comparing responses of a conventional lower order LC band pass filter, a conventional higher order LC band pass filter, and a very wide bandwidth band pass filter with steep roll-off, according to a representative embodiment.

Referring to FIG. 3, trace 310 shows insertion loss as function of signal frequency of a conventional lower order LC band pass filter, and trace 320 shows insertion loss as function of signal frequency of a conventional higher order LC band pass filter. As discussed above, the lower order LC band pass filter (trace 310) is more typically used as the conventional choice since it provides a very wide bandwidth with an acceptable level of low insertion loss (e.g., about −2.0 dB to about −3.0 dB), where the higher order LC band pass filter (trace 320) has greater insertion loss (e.g., about −3.0 dB to about −5.0 dB). The trade-off, though, is that the passband of the lower order LC band pass filter (trace 310) has a shallower (less steep) roll-off than the passband of the higher order LC band pass filter (trace 320). In comparison, the very wide bandwidth band pass filter with steep roll-off (trace 330), according to a representative embodiment, provides the benefits of both the low insertion loss of the lower order LC band pass filter (trace 310) and the steep roll-off of the higher order LC band pass filter (trace 320). Indeed, in various embodiments, the very wide bandwidth band pass filter with steep roll-off (trace 330) has a passband with a steeper roll-off than that of the higher order LC band pass filter (trace 320).

Figure 4A:
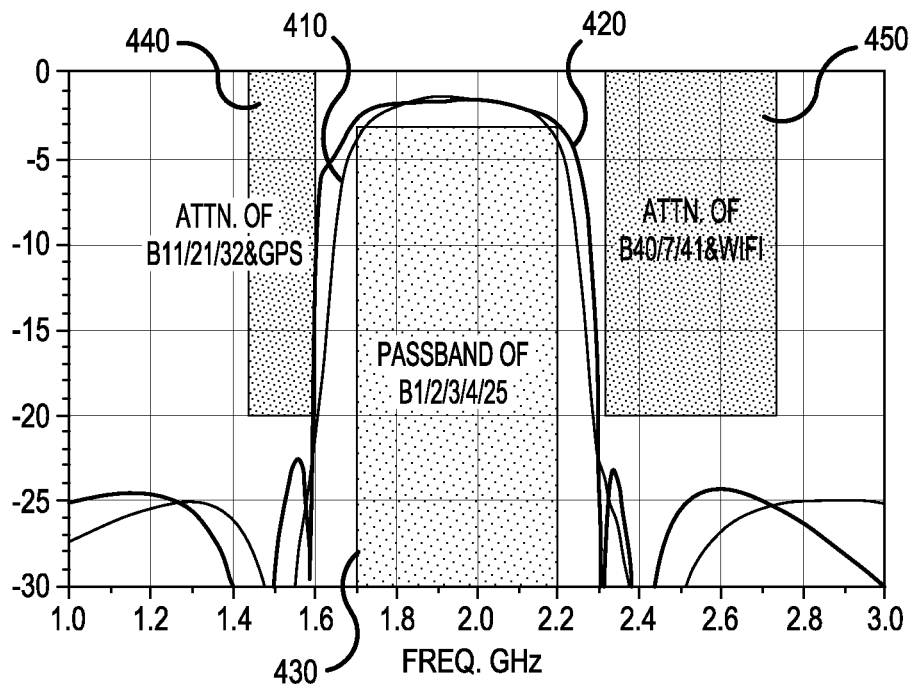
FIG. 4A is a graph showing insertion loss as function of signal frequency, for purposes of comparing responses of a conventional lower order LC band pass filter and a very wide composite bandwidth band pass filter with steep roll-off on both sides of a passband, according to a representative embodiment.
Figure 4B:
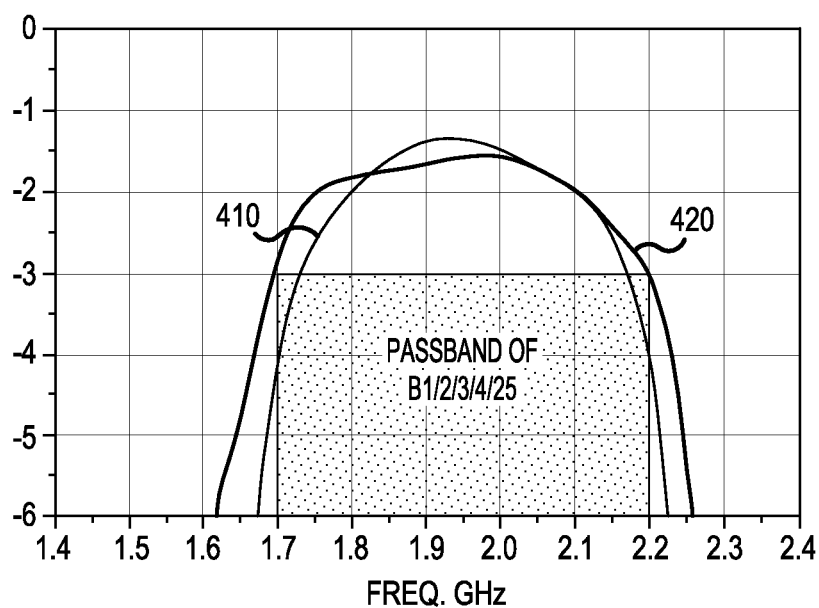
FIG. 4B is a graph showing zoomed-in portions of the graph shown in FIG. 4A.

FIG. 4A is a graph showing insertion loss as function of RF signal frequency, for purposes of comparing responses of a conventional lower order LC band pass filter and a very wide bandwidth band pass filter with steep roll-off, according to a representative embodiment. FIG. 4B is a graph showing zoomed-in portions of the graph shown in FIG. 4A, particularly above −5 dB.

Referring to FIGS. 4A and 4B, trace 410 shows insertion loss as function of signal frequency of a conventional lower order LC band pass filter, and trace 420 shows insertion loss as function of signal frequency of a very wide bandwidth composite band pass filter, according to a representative embodiment (e.g., very wide bandwidth band pass filter 200). In the depicted example, a combined passband 430, determined at −3 dB insertion loss, is provided for multiple representative transmit and receive frequency bands, including band 1 (uplink 1920-1980 MHz; downlink 2110-2170 MHz), band 2 (uplink 1850-1910 MHz; downlink 1930-1990 MHz), band 3 (uplink 1710-1785 MHz; downlink 1805-1880 MHz), band 4 (uplink 1710-1755 MHz; downlink 2110-2155 MHz), and band 25 (uplink 1850-1915 MHz; downlink 1930-1995 MHz). As is clear in FIG. 4A, the roll-off of the passband 430 provided by trace 420 (very wide bandwidth band pass filter, according to a representative embodiment) is steeper than that provided by trace 410 (conventional lower order LC band pass filter).

FIG. 4A also shows combined passbands 440 and 450 for various adjacent frequency bands, illustrating the advantage of a steep roll-off for the combined passband 430. That is, the steep roll-off prevents overlap, and thus interference, with neighboring frequency bands. In the depicted example, the combined passband 440 is provided for multiple transmit and receive frequency bands, including band 11 (uplink 1427.9-1452.9 MHz; downlink 1475.9-1500.9 MHz) (where "Attn.=Attenuation"; where FIG. 4 shows good isolation between the passband and the 440&450), band 21 (uplink 1447.9-1462.9 MHz; downlink 1495.5-1510.9 MHz), band 32 (uplink 1710-1785 MHz; downlink 1805-1880 MHz), and global positioning system (GPS) (allocation 1575.42 MHz). Meanwhile, the combined passband 450 is provided for multiple transmit and receive frequency bands, including band 40 (allocation 2300-2400 MHz), band 7 (uplink 2500-2570 MHz; downlink 2620-2690 MHz), band 41 (allocation 2496-2690 MHz), and WiFi (allocation 2400-2500 MHz). The combined passbands 440 and 450 for adjacent frequency bands are of particular concern when two or more very wide bandwidth band pass filters are present in a multiplexer, as discussed below.

FIGS. 1 and 2 depict embodiments in which an LC band pass filter 110, 210 is connected in parallel with two high-Q acoustic filters, e.g., a first high-Q acoustic filter 120, 220 and a second high-Q acoustic filter 130, 230. In alternative embodiments, however, the LC band pass filter 110 may be connected in parallel with only one high-Q acoustic filter, e.g., the first high-Q acoustic filter 120, 220 or the second high-Q acoustic filter 130, 230. This may be the case, for example, when a closely adjacent frequency band (or combined passband) is present on only one side of the passband of the LC band pass filter 110, requiring a steep roll-off only on that one side.

Figure 5:
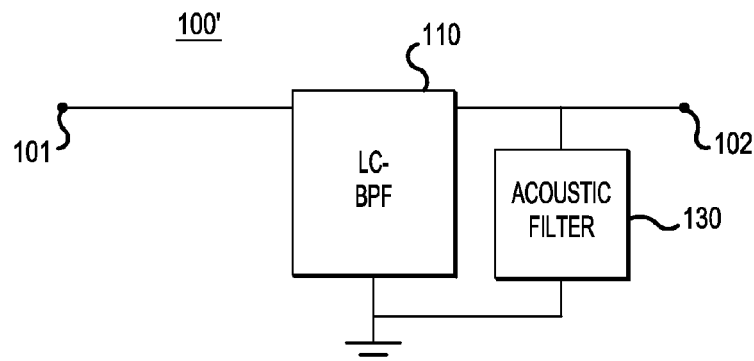
FIG. 5 is a circuit diagram of a very wide bandwidth composite band pass filter with steep roll-off on one side of a passband, according to a representative embodiment.
Figure 6:
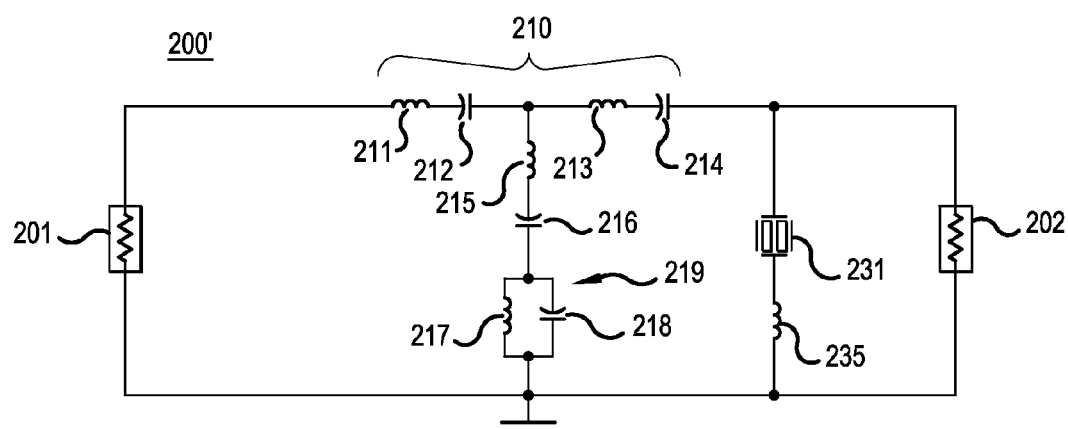
FIG. 6 is a circuit diagram of a very wide bandwidth band composite pass filter with steep roll-off on one side of a passband, according to a representative embodiment.

FIG. 5 is a simplified diagram of a very wide bandwidth band pass filter with steep roll-off on one side of a passband, according to a representative embodiment, and FIG. 6 is a circuit diagram of a very wide bandwidth band pass filter with steep roll-off on one side of a passband, according to a representative embodiment. Referring to FIG. 5, very wide bandwidth composite band pass filter 100' includes LC band pass filter 110 connected in parallel with only one high-Q acoustic filter, e.g., second high-Q acoustic filter 130. The LC band pass filter 110 and the second high-Q acoustic filter 130 may be configured substantially the same as discussed above with regard to FIG. 1. However, with only one high-Q acoustic filter, the very wide bandwidth composite band pass filter 100' will provide a passband having only one side (e.g., the higher frequency side in the depicted example) with the steep roll-off associated with the second high-Q acoustic filter 130.

Similarly, referring to FIG. 6, very wide bandwidth composite band pass filter 200' includes LC band pass filter 210 connected in parallel with only high-Q acoustic filter 230. The LC band pass filter 210 ultra and the high-Q acoustic filter 230 may be configured substantially the same as discussed above with regard to FIG. 2. However, with only one high-Q acoustic filter, the very wide bandwidth composite band pass filter 200' will provide a passband having only one side (e.g., the higher frequency side in the depicted example) with the steep roll-off associated with the high-Q acoustic filter 230.

Figure 7:
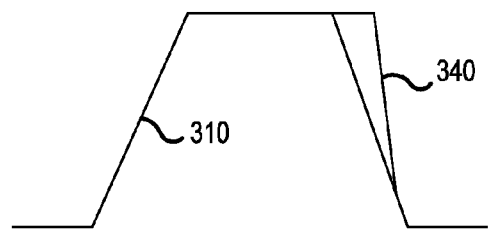
FIG. 7 is a simplified graph showing insertion loss as function of signal frequency, for purposes of comparing responses of a conventional lower order LC band pass filter and a very wide bandwidth band pass filter with steep roll-off on one side of a passband, according to a representative embodiment.

FIG. 7 is a simplified graph showing insertion loss as function of RF signal frequency, for purposes of comparing responses of a conventional lower order LC band pass filter and a very wide bandwidth band pass filter with steep roll-off on one side of the passband, according to a representative embodiment. Referring to FIG. 7, trace 310 shows insertion loss as function of signal frequency of a conventional lower order LC band pass filter, the same as shown in FIG. 3, above. In comparison, the very wide bandwidth band pass filter with steep roll-off on one side of the pass band (trace 340), according to a representative embodiment, provides the benefits of maintaining the low insertion loss of the lower order LC band pass filter (trace 310) and providing a steep roll-off on the high frequency side of the passband.

Figure 8:
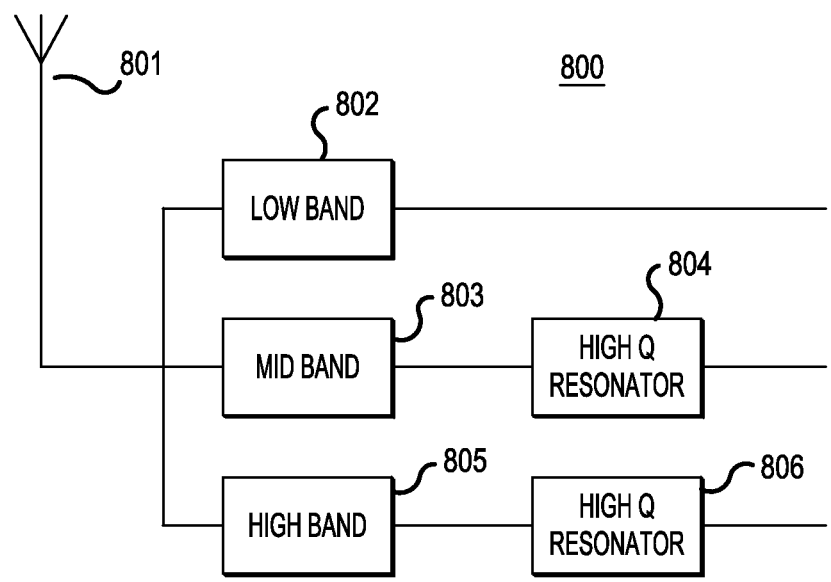
FIG. 8 is a block diagram of a multiplexer according to a representative embodiment.

FIG. 8 is a block diagram of a multiplexer 800, according to a representative embodiment. Various aspects of the components of the multiplexer 800 are common to those of the representative embodiments described above. These common aspects and details thereof are not necessarily repeated in order to avoid obscuring the presently described representative embodiments.

Referring to FIG. 8, the multiplexer 800 comprise an antenna 801. The antenna is connected to a low-band branch comprising a low band filter 802; a first filter branch comprising a mid-band filter 803 in series with a first high-Q resonator 804; and a second filter branch comprising a high-band filter 805 in series with a second high-Q resonator. In accordance with a representative embodiment, and just by way of example, the low-band branch passes electrical signals having frequencies in the range of approximately 0 GHz to approximately 0.96 GHz; the first filter branch is configured to pass signals having frequencies in the range of approximately 1.7 GHz to approximately 2.17 GHz; and the second filter branch is configured to pass signals having frequencies in the range of approximately 2.3 GHz to approximately 2.69 GHz. Further description of the characteristics of the filter branches of the multiplexer 800 below illustrates these frequency ranges. However, it is emphasized that these noted frequency ranges are merely illustrative and are not intended to be restrictive of the present teachings.

Generally, the low band filter 802 comprises an LC band pass filter. The mid-band filter 803 of the first filter branch comprises a first LC bandpass filter (not shown in FIG. 8) connected in series with the first high-Q resonator 804, which is illustratively a BAW resonator (not shown in FIG. 8). Similarly, the high-band filter 805 of the second filter branch comprises a second LC bandpass filter (not shown in FIG. 8) connected in series with the second high-Q resonator 806, which is illustratively a BAW resonator (not shown in FIG. 8). Notably, the first and second high-Q resonators 804, 806 may each comprise a single BAW resonator to provide the high-roll off filtering function described below. Alternatively, the first and second high-Q resonators 804, 806 may each comprise a series BAW resonator and a shunt BAW resonator. Still alternatively, the first and second high-Q resonators 804, 806 may each comprise two BAW resonators connected in series. The use of two series BAW resonators, or series/shunt resonators generally provides a higher degree of roll-off compared to a single BAW resonator in the first and second branches, but also come at the cost of reduced insertion loss.

The first LC band pass filters of the mid-band filter 803 connected in series with the first high-Q resonator 804, and the high-band filter 805 connected in series with the second high-Q acoustic resonator 806 each a combined passband having a very comparatively wide bandwidth with steep combined roll-off, while maintaining low insertion loss, as compared to a conventional very wide bandwidth filter consisting only of an LC band pass filter. Generally, the LC band pass filters of the mid-band filter 803 and the high-band filter 805 provide a passband having a very wide bandwidth. For example, a bandwidth (of the LC band pass filters) is considered a very wide bandwidth when it is at least about eight percent of center frequency $f_{center}$ of the passband, where the center frequency is a measure of a central frequency between upper and lower cutoff frequencies of the passband. Each of the first and second high-Q resonators 804, 806 has corresponding first and second stopbands, respectively. For example, each of a first roll-off of the first high-Q acoustic resonator 804 and a second roll-off of the second high-Q acoustic resonator 806 is substantially vertical, and thus steeper than the passband roll-off of the LC band pass filters of the mid-band filter 803, and the high-band filter 805.

Figure 9:
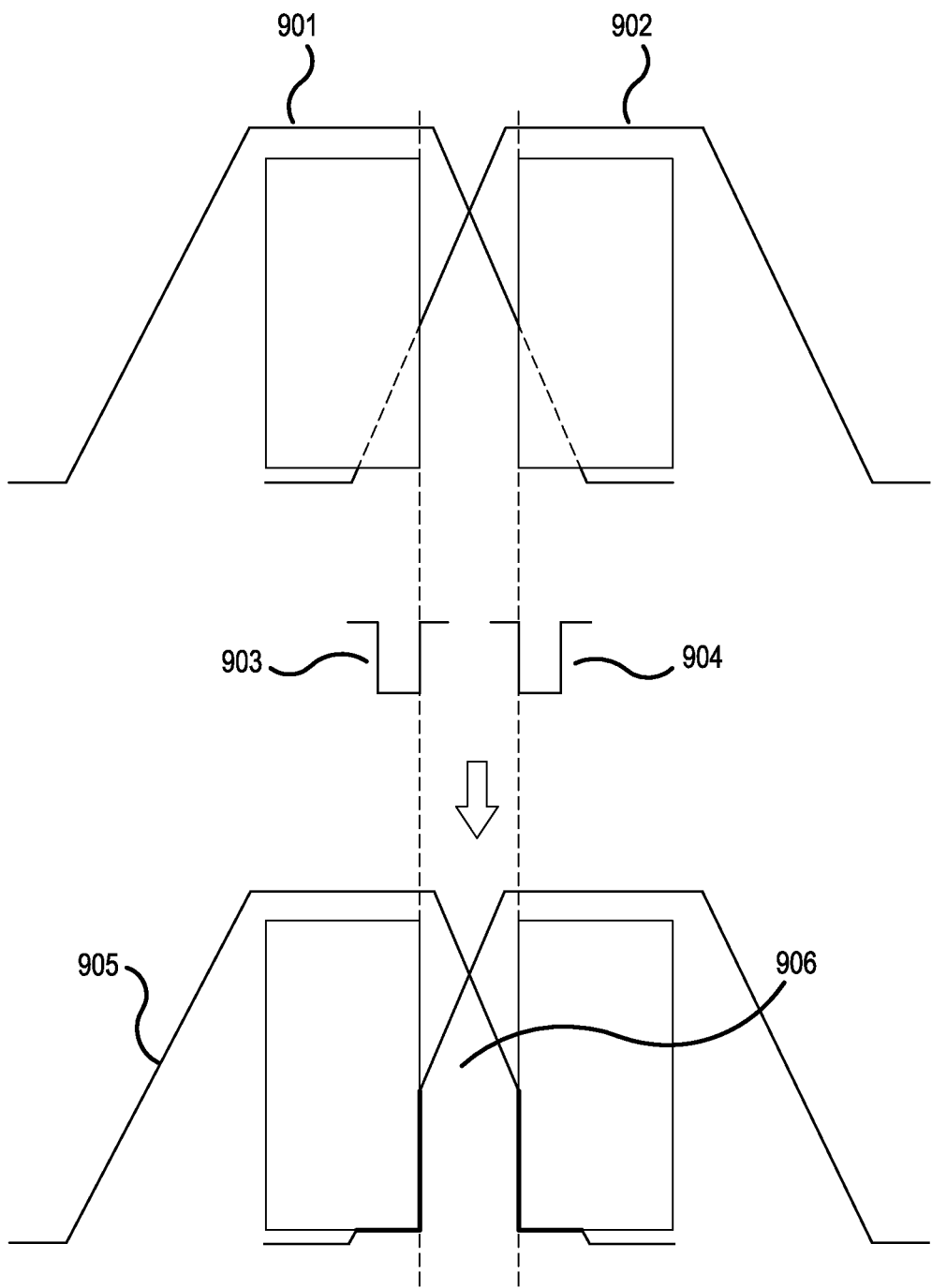
FIG. 9 is a simplified graph of a passband of a multiplexer according to a representative embodiment.

The general characteristics of the components of the first branch and the second branch of the multiplexer 800 can be appreciated from a review of FIG. 9, which depicts the separate and combined pass bands of the LC bandpass filters of the mid-band filter 803, and the high-band filter 805, and the first and second high-Q resonators 804, 806. Notably, the pass band 901 of the LC filter of the mid-band filter 803, and the pass band 902 of the high-band LC filter 805 are each comparatively large, and with comparatively poor roll-off, with unacceptable power levels in the neighboring mid-band and high-band, as depicted by the dashed lines. The first high-Q resonator 804 has a comparatively sharp roll-off 903, which is substantially vertical. Similarly, the second high-Q resonator 806 has a comparatively sharp roll-off 904, where, illustratively sharp roll-off refers to roll-off that is less than approximately two percent of the center frequency $f_{center}$. Thus, the series combination of the LC bandpass filters of the mid-band filter 803 and the first high-Q resonator 804, and the high-band filter 805 and the second high-Q resonator 806 provides a comparatively strong isolation between the mid-band and the high-band frequencies. To this end, at region 906, the stop-band characteristics of the first high-Q resonator 804 and the second high-Q resonator 806 result in sufficient attenuation between the pass bands of the mid-band (pass band 901) and the high-band (pass band 902). In region 906, in an illustrative example, over the frequency range of approximately 2.170 GHz to approximately 2.300 GHz, the isolation is approximately −25 dB.

The addition of the first and second high-Q resonators 804, 806, connected in series with respective mid-band and high-band filters 803,805, therefore results in the first stopband curtailing one side (e.g., a low frequency side) of the passband 905 and the second stopband curtailing the other side (e.g., a high frequency side) of the passband 905, thereby increasing the steepness of the passband roll-off of the passband of the LC band pass filters of the mid-band and high-band filters 803,805, providing a steep combined roll-off. In other words, a portion of the first stopband (roll-off 903) is within one side of the pass band 901, and a portion of the second stopband (roll-off 904) is within another side of the passband 902, forming the combined passband with the steep combined roll-off. For example, the combined roll-off may be considered satisfactorily steep when it is less than about two percent of the center frequency $f_{center}$. At the same time, the addition of the first and second high-Q resonators 804, 806 maintains (or decreases) the insertion loss, and has little to no effect on the very wide bandwidth of the passband provided by the LC band pass filters of the respective mid-band and high-band filters 803,805. That is, a frequency range of the combined passband is approximately the same as a total frequency range of the passbands of the mid band and high-band filters 803,805.

Figure 10:
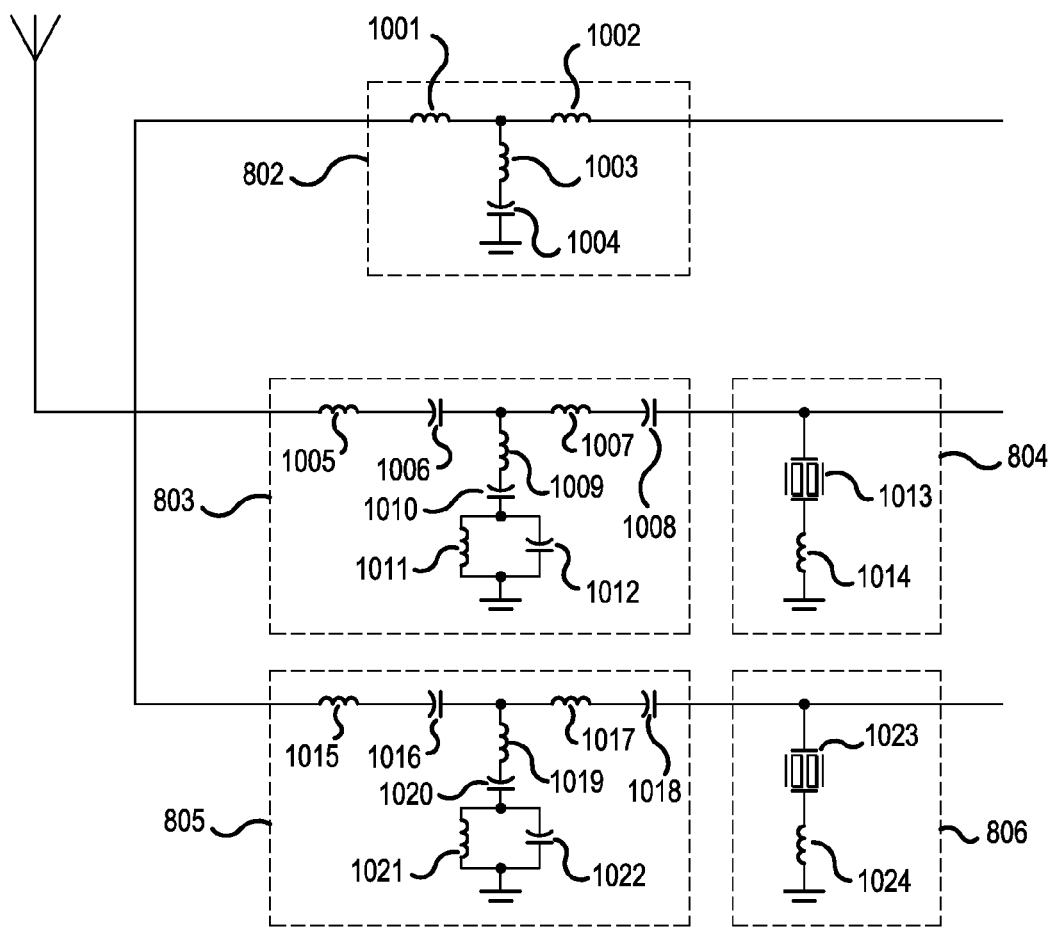
FIG. 10 is a circuit diagram of a multiplexer according to a representative embodiment.

FIG. 10 is a circuit diagram of multiplexer 800 with steep roll-off at the passbands of respective mid-band and high-band frequencies, according to a representative embodiment. Many aspects of the multiplexer 800 are common to other circuits described above, and details thereof may not be repeated in order to avoid obscuring the presently described representative embodiment.

The circuit diagram of FIG. 10 is an illustrative implementation of the block diagram of FIG. 8, although other circuit configurations of the mid-band and high-band filters 803, 805, and/or the first and second high-Q resonators 804,806, may be incorporated without departing from the scope of the present teachings. Just by way of example, as noted above, the first high-Q resonator 804, or the second high-Q resonator 806, or both, could comprise two series acoustic resonators (BAW or SAW), or series/shunt acoustic resonators instead of the single acoustic resonators depicted in FIG. 10.

Referring to FIG. 10, the multiplexer 800 comprises the low-band filter 802, which comprises an LC filter, comprising a first inductor 1001 and a second inductor 1002 in parallel with a series combination of a third inductor 1003 and a first capacitor 1004, which is connected to ground. The input to the low-band filter 802 is illustratively a 50Ω impedance) and is connected to the antenna 801. An output (not shown) of the low-band filter 802 may be connected to a transceiver (not shown).

The multiplexer 800 also comprises the mid-band filter 803 in series with the first high-Q resonator 804, forming the first filter branch of the multiplexer 800. As depicted, the first filter branch is connected electrically in parallel with the low-band filter 802. The mid-band filter 803 comprises an LC band pass filter comprising a fifth inductor 1005 in series with a second capacitor 1006, a sixth inductor 1007, and a third capacitor 1008. This series combination is in parallel with a seventh inductor 1009 and a fourth capacitor 1010, which are connected in series with a parallel combination of a seventh inductor 1011 and a fifth capacitor 1012. The parallel combination of the seventh inductor 1011 and the fifth capacitor 1012 are connected electrically to ground.

The mid-band filter 803 is electrically connected in parallel with the first high-Q resonator 804, which comprises a series combination of an FBAR 1013 (or SMR), and an eighth inductor 1014, connected electrically to ground. The input to the mid-band filter 803 is illustratively a 50Ω impedance) and is connected to the antenna 801. An output (not shown) of the mid-band filter 803 may be connected to a transceiver (not shown).

The multiplexer 800 also comprises the high-band filter 805 which is electrically connected in parallel with the second high-Q resonator 806, forming the second filter branch of the multiplexer 800. As depicted, the second filter branch is connected electrically in parallel with the first branch and the low-band filter 802. The high-band filter 805 comprises an LC band pass filter comprising an eighth inductor 1015 in series with a sixth capacitor 1016, a ninth inductor 1017, and a seventh capacitor 1018. This series combination is electrically connected in parallel with a tenth inductor 1019 and an eighth capacitor 1020, which are connected in series with a parallel combination of an eleventh inductor 1021 and a ninth capacitor 1022. The parallel combination of the eleventh inductor 1021 and the ninth capacitor 1022 are connected electrically to ground.

The various components, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A very wide bandwidth composite band pass filter with steep roll-off of a corresponding passband, the very wide bandwidth composite band pass filter comprising:
   a band pass filter having a corresponding passband with a very wide bandwidth and a passband roll-off, the band pass filter being an inductor capacitor (LC) filter comprising at least one inductor and at least one capacitor; and
   a first high-Q acoustic filter having a corresponding first stopband with a first roll-off steeper than the passband roll-off, the first high-Q acoustic filter being connected in parallel with the band pass filter such that a portion of the first stopband is within the passband of the band pass filter, forming a combined passband, wherein a frequency range of the combined passband is approximately the same as a frequency range of the passband of the band pass filter; and
   a second high-Q acoustic filter having a corresponding second stopband with a second roll-off steeper than the passband roll-off, the second high-Q acoustic filter being connected in parallel with the band pass filter such that a portion of the second stopband is within the passband of the band pass filter, forming the combined passband,
   wherein the combined roll-off of the combined passband is steeper on both sides than the passband roll-off of the band pass filter.

2. The very wide bandwidth composite band pass filter of claim 1, wherein the LC filter comprises:
   a first inductor and a first capacitor connected in series between an input terminal and a first node;
   a second inductor and a second capacitor connected in series between the first node and an output terminal; and
   a third inductor, a third capacitor, and a parallel LC circuit connected in series between the first node and a ground voltage.

3. The very wide bandwidth composite band pass filter of claim 2, wherein the parallel LC circuit comprises:
   a fourth inductor and a fourth capacitor connected in parallel between the third capacitor and the ground voltage.

4. The very wide bandwidth composite band pass filter of claim 1, wherein each of the first and second high-Q acoustic filters comprises at least one acoustic resonator.

5. The very wide bandwidth composite band pass filter of claim 4, wherein the at least one acoustic resonator of each of the first and second high-Q acoustic filters comprises one of a bulk acoustic wave (BAW) resonator or a surface acoustic wave (SAW) resonator.

6. The very wide bandwidth composite band pass filter of claim 5, wherein the BAW resonator comprises at least one of a thin film bulk acoustic resonator (FBAR) or a solidly mounted resonator (SMR).

7. A very wide bandwidth composite band pass filter, comprising:
   a very wide bandwidth LC band pass filter having a corresponding passband with a passband roll-off, the very wide bandwidth LC band pass filter comprising at least one inductor, at least one capacitor, and no acoustic resonator;
   a first high-Q acoustic filter having a corresponding first stopband with a first roll-off steeper than the passband roll-off, the first high-Q acoustic filter being connected in parallel with the very wide bandwidth LC band pass filter such that a first portion of the first stopband is within the passband of the very wide bandwidth LC band pass filter; and
   a second high-Q acoustic filter having a corresponding second stopband with a second roll-off steeper than the passband roll-off, the second high-Q acoustic filter being connected in parallel with the very wide bandwidth LC band pass filter such that a second portion of the second stopband is within the passband of the very wide bandwidth LC band pass filter;
   wherein the passband, the first portion of the first stopband and the second portion of the second stopband form a combined passband with a combined passband roll-off, a frequency range of the combined passband being approximately the same as a frequency range of the passband of the very wide bandwidth LC band pass filter, and the combined passband roll-off being steeper than the passband roll-off of the very wide bandwidth LC band pass filter.

8. The very wide bandwidth composite band pass filter of claim 7, wherein a width of the combined passband is at least eight percent of center frequency $f_{center}$ of the combined passband, the center frequency being a measure of a central frequency between upper and lower cutoff frequencies.

9. The very wide bandwidth composite band pass filter of claim 7, wherein the combined passband roll-off is less than about two percent of the center frequency $f_{center}$.

10. A multiplexer, comprising:
   a first filter branch, comprising: a first band pass filter having a corresponding first passband with a very wide bandwidth and a first passband roll-off, the first band pass filter being a first inductor capacitor (LC) filter comprising at least one inductor and at least one capacitor; a first high-Q acoustic filter having a corresponding first stopband with a first roll-off steeper than the first passband roll-off, the first high-Q acoustic filter being connected in parallel with the first band pass filter such that a portion of the first stopband is within the first passband of the band pass filter, forming a first combined passband, a first frequency range of the first combined passband being approximately the same as a first frequency range of the first passband of the first band pass filter, wherein a first combined roll-off of the first combined passband is steeper on one side than the first passband roll-off of the first band pass filter on the corresponding one side; and a second filter branch, comprising: a second band pass filter having a corresponding second passband with a very wide bandwidth and a second passband roll-off, the second band pass filter being a second inductor capacitor (LC) filter comprising at least one inductor and at least one capacitor; a second high-Q acoustic filter having a corresponding second stopband with a second roll-off steeper than the second passband roll-off, the second high-Q acoustic filter being connected in parallel with the second band pass filter such that a portion of the second stopband is within the second passband of the second band pass filter, forming a second combined passband, a second frequency range of the second combined passband being approximately the same as a second frequency range of the second passband of the second band pass filter, wherein a second combined roll-off of the second combined passband is steeper on one side than the second passband roll-off of the second band pass filter on the corresponding one side.

11. The multiplexer of claim 10, wherein the first filter branch comprising a first input connected to an antenna, and the second filter branch comprises a second input connected to the antenna.

12. The multiplexer of claim 11, further comprising:
a first high-Q resonator configured to receive an output from the first filter branch; and
a second high-Q resonator configured to receive an output from the second filter branch.

13. The multiplexer of claim 12, wherein the first and second high-Q resonators each comprise a single bulk acoustic wave (BAW) resonator.

14. The multiplexer of claim 10, wherein each of the first and second high-Q acoustic filters comprises at least one acoustic resonator.

15. The multiplexer of claim 14, wherein the at least one acoustic resonator of each of the first and second high-Q acoustic filters comprises one of a bulk acoustic wave (BAW) resonator or a surface acoustic wave (SAW) resonator.

16. The multiplexer of claim 15, wherein the BAW resonator comprises at least one of a thin film bulk acoustic resonator (FBAR) or a solidly mounted resonator (SMR).

17. The multiplexer of claim 10, wherein each of the first and second LC filters comprise:
a first inductor and a first capacitor connected in series between an input terminal and a first node;
a second inductor and a second capacitor connected in series between the first node and an output terminal; and
a third inductor, a third capacitor, and a parallel LC circuit connected in series between the first node and a ground voltage.

18. The multiplexer of claim 17, wherein the parallel LC circuit comprises:
a fourth inductor and a fourth capacitor connected in parallel between the third capacitor and the ground voltage.

* * * * *